United States Patent [19]

Manning

[11] Patent Number: 5,757,705
[45] Date of Patent: May 26, 1998

[54] SDRAM CLOCKING TEST MODE

[75] Inventor: Troy A. Manning, Boise, Id.

[73] Assignee: Micron Technology, Inc., Boise, Id.

[21] Appl. No.: 787,149

[22] Filed: Jan. 22, 1997

[51] Int. Cl.$^6$ ............................................. G11C 7/00
[52] U.S. Cl. .................. 365/201; 365/189.03; 365/191; 365/233
[58] Field of Search .................... 365/201, 233, 365/191, 189.03, 189.05

[56] References Cited

U.S. PATENT DOCUMENTS

5,386,385   1/1995   Stephens, Jr. ................... 365/195 X
5,450,364   9/1995   Stephens, Jr. et al. ........... 365/201 X

*Primary Examiner*—Do Hyun Yoo
*Attorney, Agent, or Firm*—Seed and Berry LLP

[57] ABSTRACT

A test circuit provides a test clock signal to a SDRAM of the type having an internal clock input. The test circuit and the SDRAM are housed in a common package having a clock terminal adapted to receive a clock signal, a clock enable terminal adapted to receive a clock enable signal, and a test enable terminal adapted to receive a test enable signal. The test circuit includes a logic circuit having inputs coupled to the clock terminal, the clock enable terminal, and the test enable terminal of the package, and an output coupled to the internal clock input of the SDRAM. The logic circuit couples the clock terminal to the output of the logic circuit in response to the clock enable signal being active and the test enable signal being inactive. The logic circuit derives the test clock signal from respective periodic signals applied to the clock and clock enable terminals and applies the test clock signal to the output of the logic circuit when the test enable signal is active. The test clock signal has a frequency that is greater than the frequencies of the periodic signals.

39 Claims, 5 Drawing Sheets

SDRAM CLOCKING TEST MODE

TECHNICAL FIELD

The present invention relates generally to a method and apparatus for testing semiconductor memory devices and particularly to a method and apparatus for generating a high-frequency internal clock signal for testing a synchronous dynamic random access memory (SDRAM).

BACKGROUND OF THE INVENTION

Figure 1:
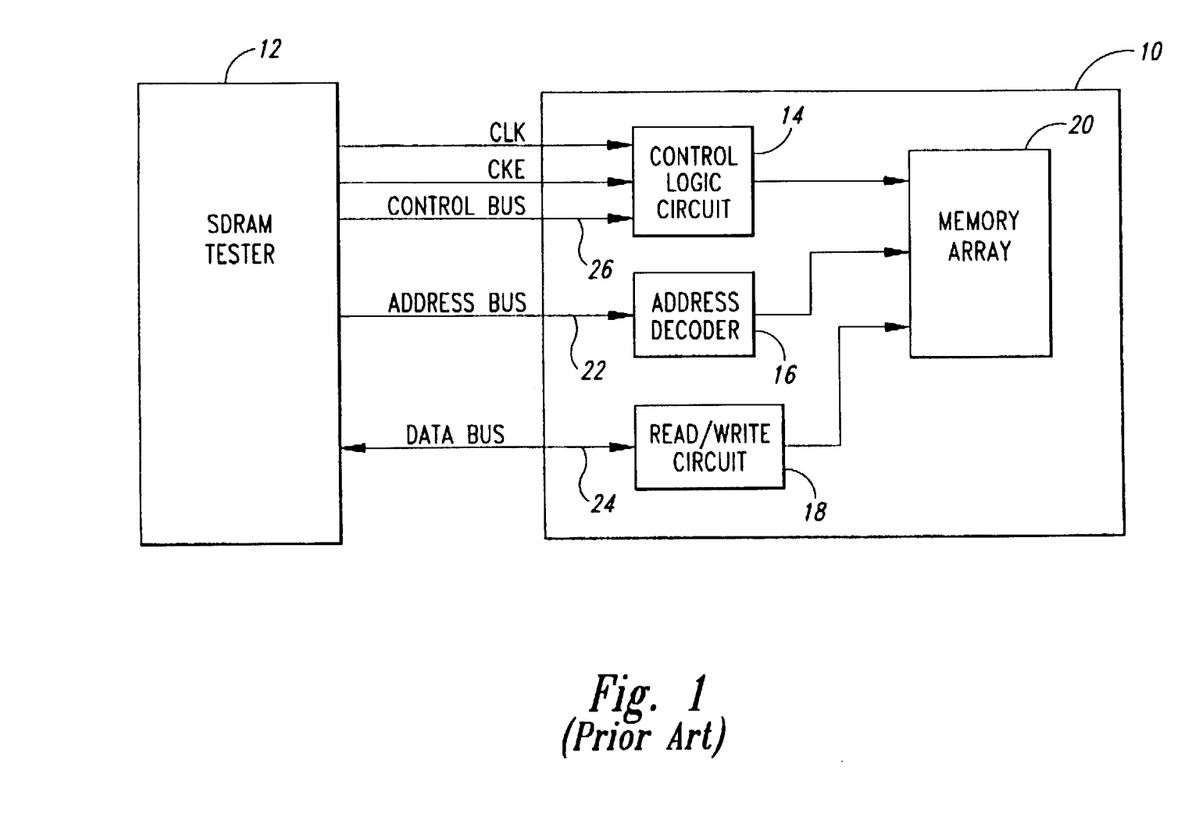
FIG. 1 is a functional block diagram of a conventional SDRAM connected to a conventional SDRAM tester.

During the manufacture of SDRAMs, as with other semiconductor memory devices, the SDRAM must be tested to assure proper operation of the device. One such test typically performed on SDRAMs is a frequency test which involves driving the SDRAM with a high-frequency clock signal and monitoring the operation of the SDRAM. A typical frequency test setup is illustrated in FIG. 1 where a conventional SDRAM 10 is coupled to a conventional SDRAM tester 12. The SDRAM 10 includes a control logic circuit 14, an address decoder 16, and a read/write circuit 18, all of which are coupled to a memory array 20. The address decoder 16 receives an address over an address bus 22 and provides a decoded address to the memory array 20 to select an individual memory cell in the memory array. The read/write circuit 18 operates to receive data over a data bus 24 and provide that data to the memory array 20 during a write operation, and to provide data from the memory array to the data bus during a read operation.

The SDRAM 10 performs data transfer operations under control of the control logic circuit 14 which receives data transfer commands, including read or write commands, over a control bus 26. In response to these data transfer commands, the control logic circuit 14 executes each of the steps required to perform a read or write data transfer operation. The control logic circuit 14 executes each of the requisite steps synchronously, with the timing of each step being established relative to a rising edge of a clock signal CLK. A clock enable signal CKE enables the clocking of the control logic circuit 14 by the clock signal CLK.

As shown in FIG. 1, the SDRAM tester 12 is coupled to the control bus 26, address bus 22, and data bus 24. The tester 12 also provides the clock signal CLK and the clock enable signal CKE. To test the SDRAM 10, the SDRAM tester 12 provides data transfer commands on the control bus, address data on the address bus 22, and either provides or receives data on the data bus 24 depending on whether the data transfer command is a read or write. In addition, the SDRAM tester 12 provides the clock signal CLK and the clock enable signal CKE in order to allow the control logic circuit 14 to synchronously perform each of the steps involved in a particular data transfer operation. Thus, the SDRAM tester 12 must be capable of providing a clock signal CLK at the desired test frequency of the SDRAM 10.

Given the current state of technology, the SDRAM tester 12 may be required to supply a clock signal CLK having a 10 nanosecond clock pulse, which corresponds to a frequency of 100 megahertz. It is known in electronics that as the frequency of operation increases, the circuitry associated with a particular application typically becomes more complex and, as a result, typically more expensive. This is due in part to the potential for coupling electromagnetic energy at high frequencies between circuit lines, the critical nature of physical line lengths at high frequencies, and the potential for small delays to result in inoperability of the circuit. Thus, the higher the frequency of the clock signal CLK which must be provided by the SDRAM tester 12, typically the more expensive the SDRAM tester. In fact, the cost of such SDRAM testers 12 typically increases exponentially with increases in the frequency of operation. For example, an SDRAM tester 12 operating at 50 megahertz may cost approximately $1 million while a SDRAM tester operating at 100 megahertz can cost up to $5 million.

One skilled in the art will appreciate that it would be advantageous to use a lower frequency SDRAM tester while at the same time driving the SDRAM with the requisite high-frequency clock signal required during frequency testing.

SUMMARY OF THE INVENTION

The present invention is a test circuit for providing a test clock signal to a SDRAM of the type having an internal clock input. The test circuit and the SDRAM are housed in a common package having a clock terminal adapted to receive a clock signal, a clock enable terminal adapted to receive a clock enable signal, and a test enable terminal adapted to receive a test enable signal. The test circuit comprises a logic circuit having inputs coupled to the clock terminal, the clock enable terminal, and the test enable terminal of the package, and an output coupled to the internal clock input of the SDRAM. The logic circuit couples the clock terminal to the output of the logic circuit in response to the clock enable signal being active and the test enable signal being inactive. The logic circuit derives the test clock signal from respective periodic signals applied to the clock and clock enable terminals and applies the test clock signal to the output of the logic circuit when the test enable signal is active. The test clock signal has a frequency that is greater than the frequencies of either of the periodic signals.

DETAILED DESCRIPTION OF THE INVENTION

The present invention allows an SDRAM tester operating at a first frequency to perform frequency tests on an SDRAM which is to be driven by a clock signal having a second frequency which is greater than the first frequency. In this way, the present invention enables less expensive SDRAM testers to be utilized for performing frequency tests on SDRAMs.

Figure 2:
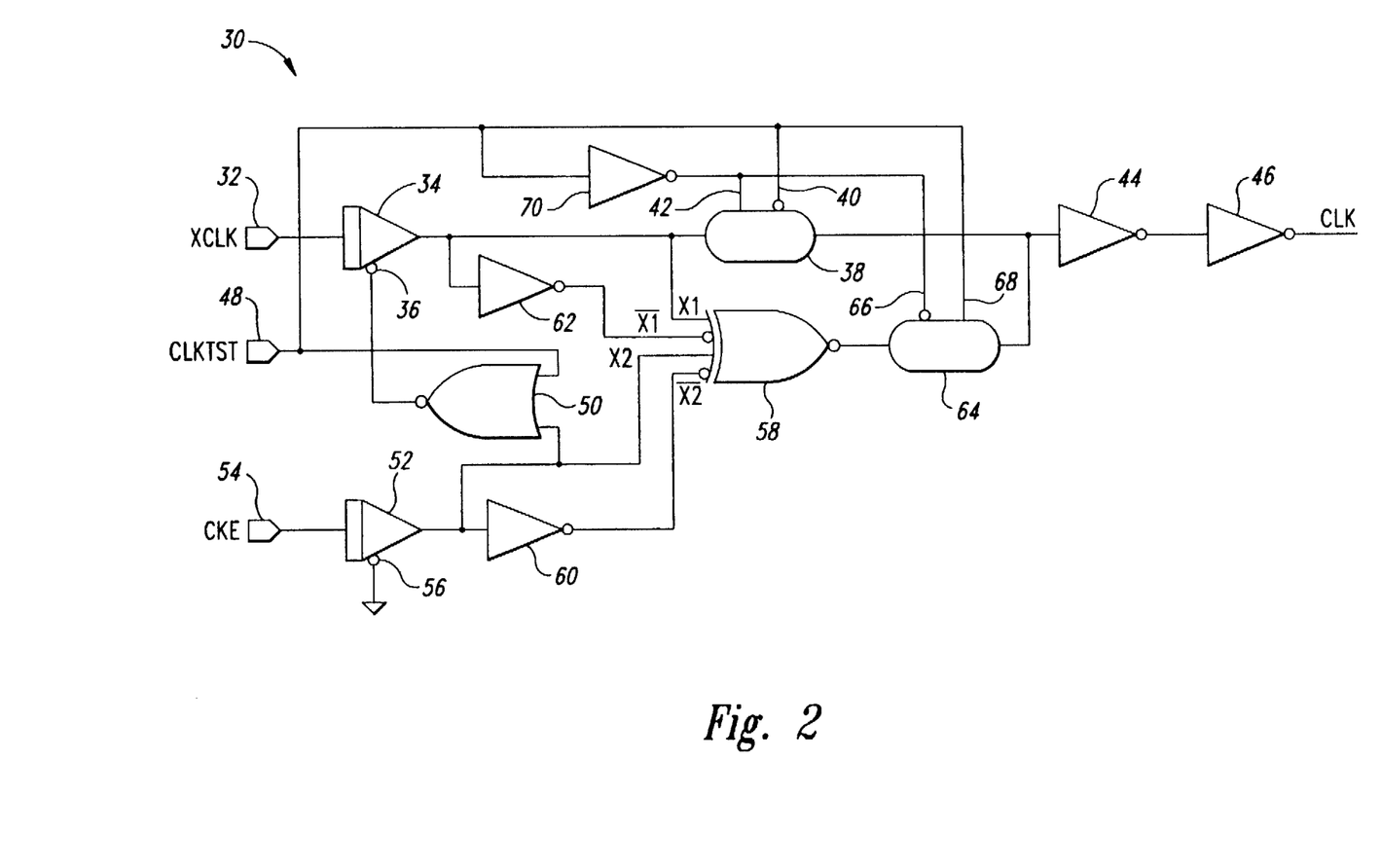
FIG. 2 is a schematic diagram of a test circuit for providing a high-frequency internal test clock signal in an SDRAM in accordance with one embodiment of the present invention.

A test circuit 30 in accordance with one embodiment of the present invention is illustrated in FIG. 2. The test circuit 30 includes a terminal 32 for receiving an external clock signal XCLK. The terminal 32 is connected to an input of a buffer circuit 34 which operates to couple its input to an output in response to a buffer enable signal on a buffer enable terminal 36. The circle on the buffer enable terminal 36 indicates that the buffer enable signal is a low true signal, which means that when the buffer enable signal has a low logic level, the input of the buffer circuit 34 is coupled to the output and, conversely, when the buffer enable signal has a high logic level, the input of the buffer circuit is isolated from the output.

The output of the buffer circuit 34 is connected to an input of a transmission gate 38 which operates to couple the input to an output in response to signals on a pair of terminals 40 and 42. A terminal 48, which receives a clock test signal CLKTST, is coupled directly to the terminal 40 and through an inverter 70 to the terminal 42. When the clock test signal CLKTST on the terminal 40 has a low logic level, the inverted signal on the terminal 42 has a high logic level, thereby coupling the input of the transmission circuit 38 to the output. Conversely, when the clock test signal CLKTST on the terminal 40 has a high logic level, the inverted signal on the terminal 42 has a low logic level, thereby isolating the input of the transmission circuit 38 from the output.

The output of the transmission circuit 38 is coupled to an input of an inverter 44 which inverts a signal provided on its input and provides that inverted signal on an output. The output of the inverter 44 is connected to another inverter 46 which likewise inverts the signal on its input and provides the inverted signal on an output. The output of the inverter 46 corresponds to the clock signal CLK which operates to drive the control logic circuit 14 of the conventional SDRAM 10 shown in FIG. 1.

The terminal 48 is further connected to a first input of a NOR gate 50, and the output of the NOR gate 50 is connected to the buffer enable terminal 36. A second input of the NOR gate 50 is connected to an output of a buffer circuit 52 which receives at its input a clock enable signal CKE applied to a terminal 54. A buffer enable terminal 56 of the buffer circuit 52 is connected to ground, which causes the input of the buffer circuit 52 to always be coupled to the output of the buffer circuit.

The output of the buffer circuit 52 is coupled directly to an input X2 of an exclusive NOR gate 58 and is coupled through an inverter 60 to an input $\overline{X2}$ of the exclusive NOR gate. Another input X1 of the exclusive NOR gate 58 is connected to the output of the buffer circuit 34. The output of the buffer circuit 34 is also coupled through an inverter 62 to an input $\overline{X1}$ of the exclusive NOR gate 58. An output of the exclusive nor gate 58 is connected to an input of a transmission circuit 64 which operates to couple the input to an output in response to signals received on a pair of terminals 66 and 68. The terminal 48, which receives the clock test signal CLKTST, is coupled directly to the terminal 68 and through the inverter 70 to the terminal 66. When the clock test signal CLKTST on the terminal 68 has a high logic level, the inverted signal on the terminal 66 has a low logic level, thereby coupling the input of the transmission circuit 64 to the output. Conversely, when the clock test signal CLKTST on terminal 68 has a low logic level, the inverted signal on terminal 66 has a high logic level, thereby isolating the input of the transmission circuit 64 from the output. Thus, when the transmission gate 64 is enabled, the transmission gate 38 is disabled, and when the transmission gate 64 is disabled, the transmission gate 38 is enabled. The output of the transmission circuit 64 is connected to the input of the inverter 44.

Operation of the test circuit 30 will now be described with reference to FIG. 2 and to the signal timing diagram shown in FIG. 3. In operation, the test circuit 30 operates in three distinct modes. The first mode is indicated in the signal timing diagram between the times $t_0$ and time $t_3$. This mode of operation is characterized by the clock enable signal CKE and the clock test signal CLKTST both having low logic levels. When both the clock enable signal CKE and the clock test signal CLKTST have low logic levels, no clock signal CLK is provided at the output of the inverter 46. With reference to FIG. 2, this mode of operation is easily understood by noting that when the clock enable signal CKE and the clock test signal CLKTST are both at low logic levels, the output of the NOR gate 50 is high, thereby disabling the buffer circuit 34 (i.e., its input isolated from output). Thus, the external clock signal XCLK is isolated by the buffer circuit 34 from the remainder of the circuitry in the test circuit 30. In addition, when the clock test signal CLKTST has a low logic level, the transmission circuit 64 is disabled so the output of the exclusive NOR gate 58 does not drive the clock signal CLK. Consequently, there is no clock signal CLK during this first mode of operation.

Referring back to FIG. 3, the second mode of operation of the test circuit 30 is characterized by the clock test signal CLKTST having a low logic level and the clock enable signal CKE having a high logic level. This mode of operation is indicated from the time $t_3$ to $t_6$ in the signal timing diagram. As can be seen from the signal timing diagram, in this mode of operation the clock signal CLK is equal to the external clock signal XCLK. Although the clock signal CLK is shown in FIG. 3 as being identical to the external clock signal XCLK, one skilled in the art will realize that there is actually a phase shift between the two signals which results from the finite delay times of the components of the test circuit 30.

Referring back to FIG. 2, in this second mode of operation the high clock enable signal CKE is provided on the output of the buffer circuit 52 and is thus provided to the input of the NOR gate 50. This high logic level on the input of the NOR gate 50 causes the output of the NOR gate to have a low logic level which accordingly enables the buffer circuit 34. With the buffer circuit 34 enabled, the external clock signal XCLK is provided on the output of the buffer circuit to the input of the transmission circuit 38. Since the clock test signal CLKTST has a low logic level in this mode of operation, the transmission circuit 38 is enabled so that the external clock signal XCLK is provided on the output of the transmission circuit and thus coupled through the inverters 44 and 46 to provide the clock signal CLK.

Figure 3:
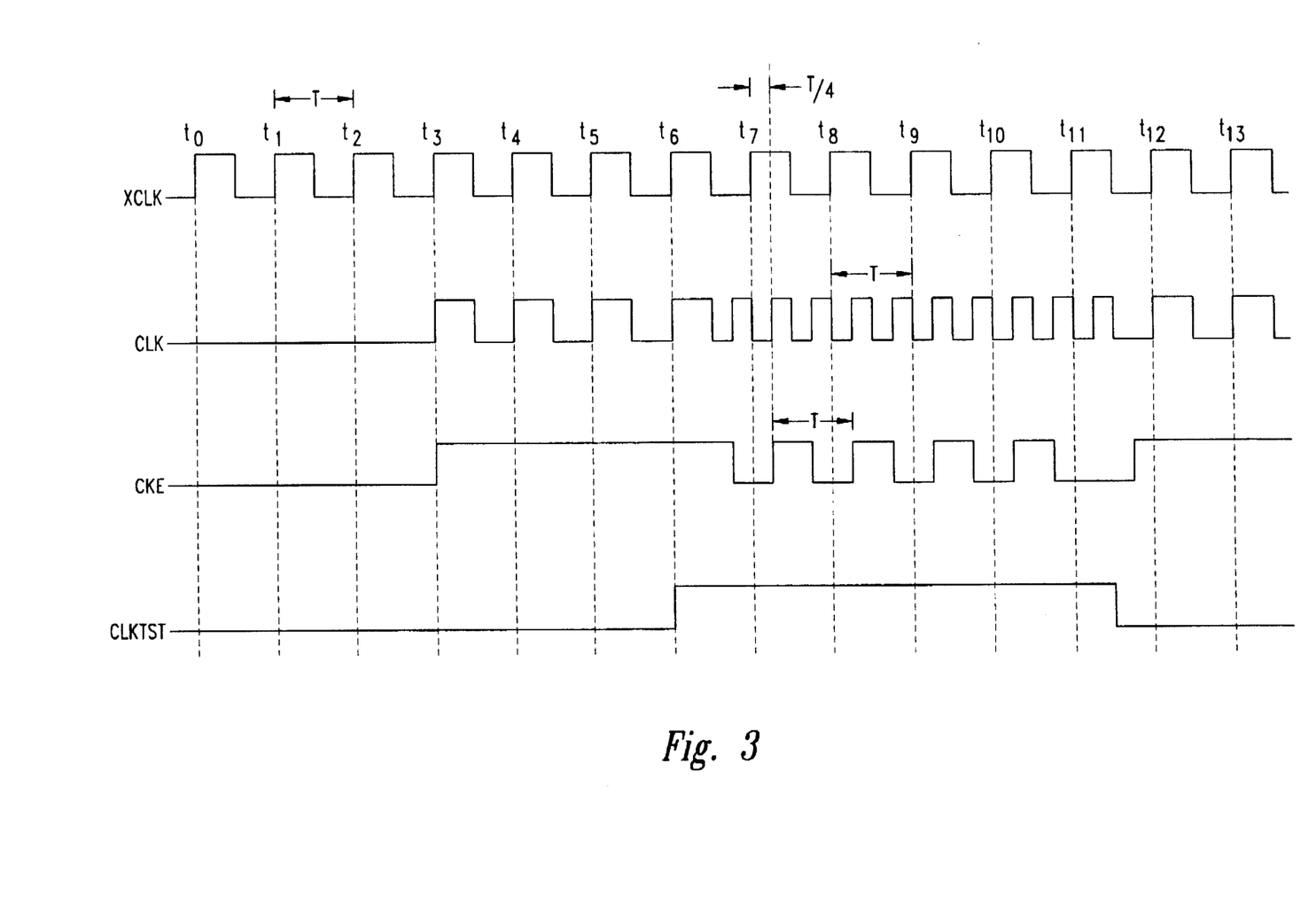
FIG. 3 is a signal timing diagram showing the timing of various signals of the embodiment of the test circuit shown in FIG. 2.

The third or test mode of operation of the test circuit 30 is illustrated in the signal timing diagram of FIG. 3 between the times $t_6$ and $t_{11}$. The test mode of operation is characterized by the clock test signal CLKTST having a high logic level and the clock enable signal CKE being pulsed at a frequency equal to the frequency of the external clock signal XCLK. The frequency of the clock enable signal CKE and the external clock signal XCLK is defined by the period T as shown for both these signals in the signal timing diagram. In addition, note that the clock enable signal CKE is phase shifted relative to the external clock signal XCLK by 90 degrees, which corresponds to one-fourth of the period T (i.e., T/4) as shown at time $t_7$. In the test mode of operation, the clock signal CLK has a frequency which is twice the frequency of the external clock signal XCLK and the clock enable signal CKE. This is illustrated between the times $t_8$ and $t_9$ in the signal timing diagram where it is seen that the clock signal CLK passes through two cycles during the period T, thus indicating that the frequency of the clock signal is doubled.

Referring back to FIG. 2, the operation of the test circuit 30 in the test mode of operation will now be described. In the test mode of operation, the clock test signal CLKTST has a high logic level which enables the buffer circuit 34 through the NOR gate 50. In addition, when the clock test signal CLKTST has a high logic level, the transmission circuit 38 is disabled and the transmission circuit 64 is enabled. During operation, the external clock signal XCLK is provided on the input X1 of the exclusive NOR gate 58 complement of this signal is provided via the inverter 62 on the input $\overline{X1}$ of the exclusive NOR gate. Similarly, the clock enable signal CKE on the output of the buffer circuit 52 is provided to the input X2 of the exclusive NOR gate 58 and the complement of this signal is provided via the inverter 60 to the input $\overline{X2}$ of the exclusive NOR gate. In response to these signals on its inputs, the exclusive NOR gate 58 provides a test clock signal on its output which has a frequency which is twice the frequency of the clock enable signal CKE and the external clock signal XCLK. As seen from the signal timing diagram, the exclusive NOR gate 58 operates such that the output of the exclusive NOR gate transitions from one logic level to the complementary logic level when either the clock enable signal CKE or the external clock signal XCLK transitions from one logic level to the complementary logic level. The test clock signal on the output of the exclusive NOR gate 58 is coupled through the enabled transmission circuit 64 and through the inverters 44 and 46 to provide the clock signal CLK in this test mode of operation.

Figure 4:
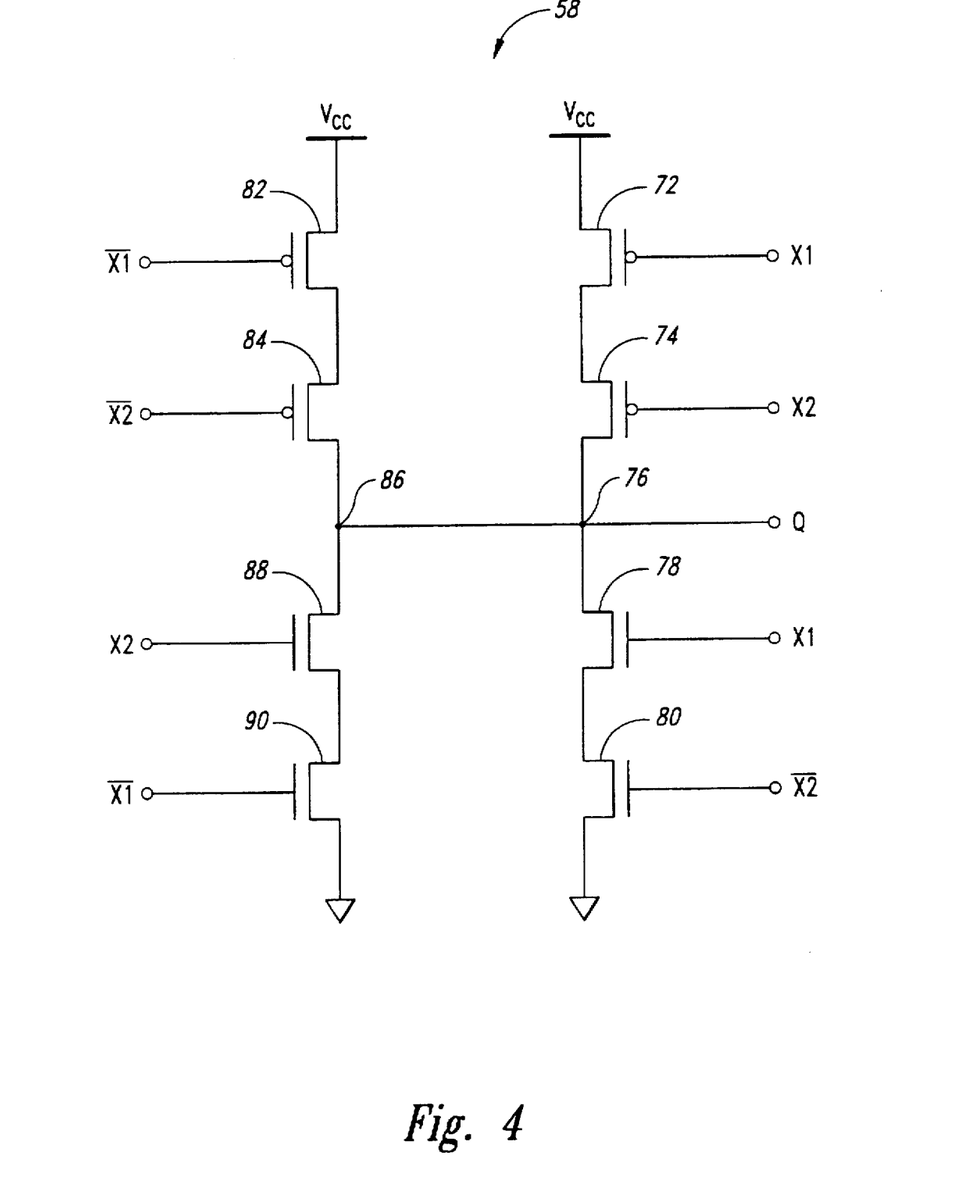
FIG. 4 is a schematic diagram of one embodiment of an exclusive NOR gate as shown in FIG. 2.

A more detailed schematic diagram of one embodiment of the exclusive NOR gate 58 is shown in FIG. 4. In this embodiment, the exclusive NOR gate 58 includes a pair of transistors 72 and 74 having their source and drain terminals connected in series between a power supply $V_{cc}$ and a node 76. The node 76 corresponds to the output Q of the exclusive NOR gate 58. The gates of the transistors 72 and 74 are connected to the inputs X1 and X2, respectively, of the exclusive NOR gate 58. A second pair of transistors 78 and 80 have their source and drain terminals connected in series between the node 76 and ground. The gates of the transistors 78 and 80 are connected to the inputs X1 and $\overline{X2}$, respectively, of the exclusive NOR gate 58.

The exclusive NOR gate 58 further includes a pair of transistors 82 and 84 having their source and drain terminals connected in series between the supply voltage $V_{cc}$ and a node 86, the node 86 being connected to the node 76. The gate terminals of the transistors 82 and 84 are connected to the inputs $\overline{X1}$ and $\overline{X2}$, respectively, of the exclusive NOR gate 58. Another pair of transistors 88 and 90 have their source and drain terminals coupled in series between the node 86 and ground. The gates of the transistors 88 and 90 are connected to the inputs X2 and $\overline{X1}$, respectively, of the exclusive NOR gate 58.

In operation, the transistors comprising exclusive NOR gate 58 operate to perform the logical function of the exclusive NOR gate. When the inputs X1 and X2 have the same logic level, either both transistors 72 and 74 or both transistors 82 and 84 will be ON, thereby placing the output Q at $V_{cc}$. Also, when the inputs $X_1$ and $X_2$ have the same logic level, one of the transistors 78 or 80 and one of the transistors 88 or 90 will be OFF, thereby isolating the output Q from ground. If $X_1$ and $X_2$ do not have the same logic level, either both transistors 78 and 80 will be ON or both transistors 88 and 90 will be ON, thereby coupling the output Q to ground. Also, when $X_1$ and $X_2$ do not have the same logic level, one of the transistors 72 or 74 and one of the transistors 82 or 84 will be OFF, thereby isolating the output Q from $V_{cc}$. For example, when the input X1 has a high logic level and the input X2 has a low logic level, the transistors 78 and 80 turn on to pull the output Q to ground. In this situation, one of the transistors in all of the other transistor pairs is turned off and therefore none of these other transistor pairs affect the output Q.

While the embodiment of the test circuit 30 shown in FIG. 3 utilizes the exclusive NOR gate 58 to generate the test clock signal, one skilled in the art will realize other circuits may also be used to perform this function. For example, two one-shot circuits could have their respective inputs coupled to the terminals 32 and 54 and their outputs coupled to inputs of an OR circuit. By selecting a proper phase shift between the signals on the terminals 32 and 54 and a duration of an output pulse from each of the one-shot circuits the test clock signal could be generated.

Figure 5:
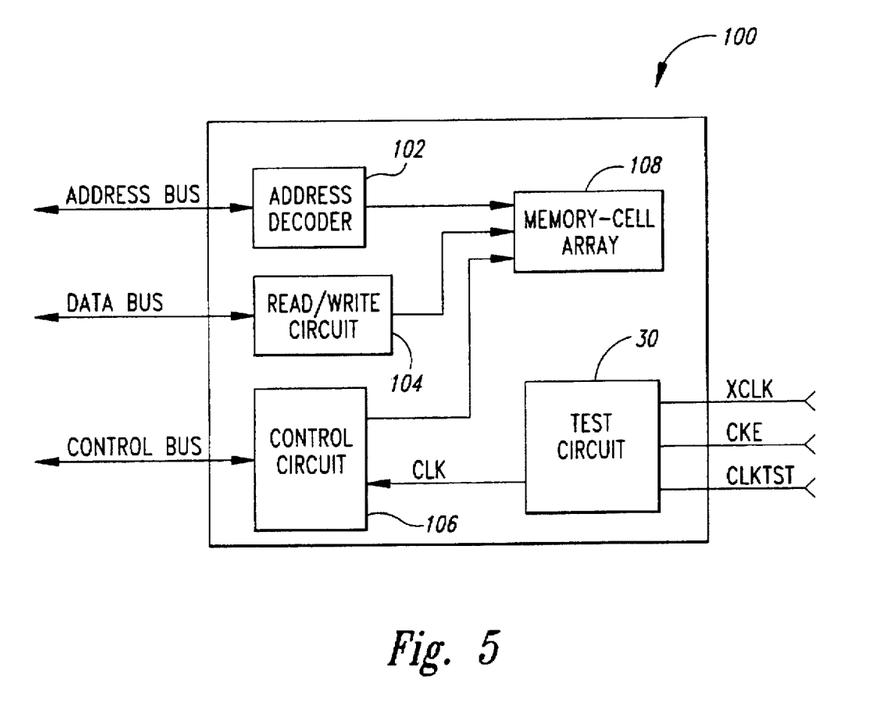
FIG. 5 is a functional block diagram of an SDRAM including the test circuit illustrated in FIG. 2.

FIG. 5 is a functional block diagram of an SDRAM 100 including a test circuit 30 in accordance with one embodiment of the present invention. The SDRAM 100 includes an address decoder 102, a read/write circuit 104, and a control circuit 106, all of which are connected to a memory cell array 108. All these components are conventional and known in the art. The test circuit 30 is coupled to the control circuit 106 to provide the clock signal CLK to the control circuit. The address decoder 102 is coupled to an address bus, the read/write circuit 104 is coupled to a data bus, and the control circuit 106 is coupled to a control bus.

In operation, external circuitry provides address, data, and control signals on the respective buses as well as the external clock signal XCLK, the clock enable signal CKE, and the clock test signal CLKTST to the SDRAM 100. During normal operation, the clock test signal CLKTST is held at a low logic level by the external circuitry and standard data transfer operations may be performed by the SDRAM 100. During normal operation, the clock enable signal CKE is transitioned to a high logic level such that the test circuit 30 provides the external clock signal XCLK as the clock signal CLK to drive the control circuit 106 so that the control circuit synchronously performs each of the steps involved in a data transfer operation.

For example, during a read data transfer operation, the control circuit 106 decodes the read command received on the control bus, and controls the latching of the address on the address bus into the address decoder 102. The address decoder 102 provides a decoded address to the memory cell array 108 and under control of the control circuit 106 the memory cell array transfers the address data to the read/write circuit 104 which provides this data on the data bus for use by the external circuitry.

During a write data transfer operation, the test circuit 30 once again provides the external clock signal XCLK on the clock signal CLK to drive the control circuit 106 such that the control circuit synchronously performs each of the steps involved in a write data transfer operation. During a write data transfer operation, the external circuitry provides a memory address on the address bus, data on the data bus, and the write command on the control bus. The control circuit 106 decodes the write command and the read/write circuit 104 latches the data provided on the data bus and the address decoder 102 latches the address on the address bus. Under control of the control circuit 106, a decoded memory address from the address decoder 102 is provided to the memory cell array 108 and the memory cell array controlled so that the data latched by the read/write circuit 104 is stored in the addressed memory cells in the memory cell array.

During the test mode operation of the SDRAM 100, external circuitry transitions the clock test signal CLKTST to a high logic level and pulses the clock enable signal CKE at the same frequency as the external clock signal XCLK. Recall, however, that the clock enable signal CKE is phase shifted relative to the external clock signal XCLK. During this mode of operation, the clock signal CLK output by the test circuit 30 has frequency of twice the external clock signal XCLK and the clock enable signal CKE. The external circuitry provides the required address, data, and control signals on the respective buses to test the SDRAM 100 during the test mode of operation.

Figure 6:
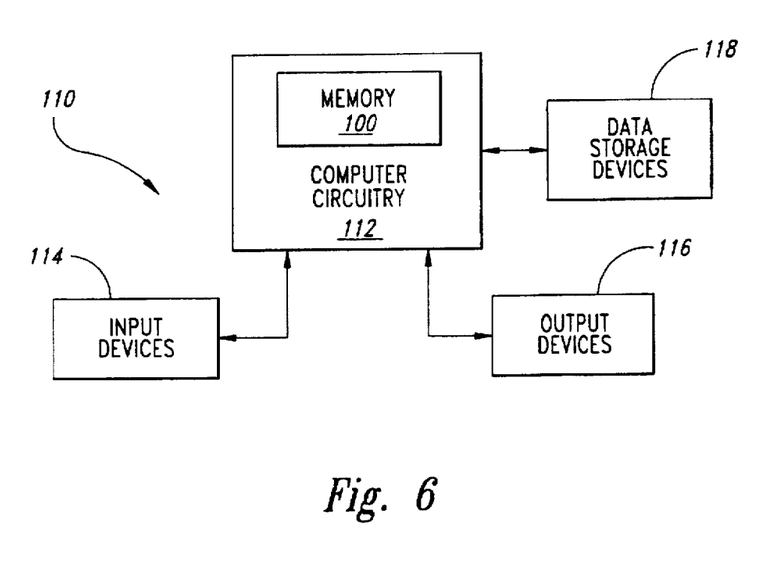
FIG. 6 is a functional block diagram of a computer system which includes the SDRAM shown in FIG. 5.

FIG. 6 is a block diagram of a computer system 110 which includes the SDRAM 100 of FIG. 5. The computer system 110 includes computer circuitry 112 for performing various computing functions, such as executing specific software to perform specific calculations or tasks. In addition, the computer system 110 includes one or more input devices 114, such as a keyboard or a mouse, coupled to the computer circuitry 112 to allow an operator to interface with the computer system. Typically, the computer system 110 also includes one or more output devices 116 coupled to the computer circuitry 112, such output devices typically being a printer or a video terminal. One or more data storage devices 118 are also typically coupled to the computer circuitry 112 to store data or retrieve data from external storage media (not shown). Examples of typical storage devices 118 include hard and floppy disks, tape cassettes, and compact disk read-only memories (CD-ROMs). The computer circuitry 112 is typically coupled to the SDRAM 100 through a control bus, a data bus, and an address bus to provide for writing data to and reading data from the SDRAM.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

I claim:

1. A test circuit for providing a test clock signal to a SDRAM of the type having an internal clock input, the test circuit and the SDRAM being housed in a common package having a clock terminal adapted to receive a clock signal, a clock enable terminal adapted to receive a clock enable signal, and a test enable terminal adapted to receive a test enable signal, the test circuit comprising a logic circuit having inputs coupled to the clock terminal, the clock enable terminal, and the test enable terminal of the package, and an output coupled to the internal clock input of the SDRAM, the logic circuit coupling the clock terminal to the output of the logic circuit responsive to the clock enable signal being active and the test enable signal being inactive, the logic circuit deriving the test clock signal from respective periodic signals applied to the clock and clock enable terminals and applying the test clock signal to the output of the logic circuit when the test enable signal is active, the test clock signal having a frequency that is greater than the frequencies of the periodic signals.

2. The test circuit of claim 1 wherein the frequencies of the respective periodic signals are equal.

3. The test circuit of claim 2 wherein the periodic signal applied to the clock enable terminal is phase shifted relative to the periodic signal applied to the clock terminal.

4. The test circuit of claim 3 wherein the frequency of the test clock signal is twice the frequency of the periodic signals.

5. A test circuit for providing a test clock signal to a SDRAM of the type having an internal clock input, the test circuit and the SDRAM being housed in a common package having a clock terminal adapted to receive a clock signal, a clock enable terminal adapted to receive a clock enable signal and at least one additional terminal adapted to receive an additional signal, the test circuit comprising a logic circuit having inputs coupled to the clock terminal, the clock enable terminal, and the additional terminal of the package, and an output coupled to the internal clock input of the SDRAM, the logic circuit coupling the clock terminal to the output of the logic circuit responsive to the clock enable signal being active and the additional terminal receiving a first signal, the logic circuit deriving the test clock signal from respective periodic signals applied to the clock and clock enable terminals and applying the test clock signal to the output of the logic circuit when the additional terminal receives a second signal, the test clock signal having a frequency that is greater than the frequencies of either of the periodic signals.

6. The test circuit of claim 5 wherein the frequencies of the respective periodic signals are equal.

7. The test circuit of claim 6 wherein the respective periodic signals are phase shifted by predetermined magnitudes relative to the periodic signal applied to the clock terminal.

8. The test circuit of claim 7 wherein the frequency of the test clock signal is the frequency of the periodic signals.

9. A test circuit for providing a test clock signal to a SDRAM of the type having an internal clock input, the test circuit and the SDRAM being housed in a common package having a clock terminal adapted to receive a clock signal and a clock enable terminal adapted to receive a clock enable signal, the test circuit comprising a logic circuit having inputs coupled to the clock terminal and the clock enable terminal and an output coupled to the internal clock input of the SDRAM, the logic circuit coupling the clock terminal to the output of the logic circuit responsive to the clock enable signal being active, and the logic circuit deriving the test clock signal from respective periodic signals applied to the clock and clock enable terminals and applying the test clock signal to the output of the logic circuit when the respective periodic signals are applied to the clock and clock enable terminals, the test clock signal having a frequency that is greater than the frequencies of the periodic signals.

10. The test circuit of claim 9 wherein the frequencies of the respective periodic signals are equal.

11. The test circuit of claim 10 wherein the respective periodic signals are phased shifted by predetermined magnitudes relative to the periodic signal applied to the clock terminal.

12. The test circuit of claim 11 wherein the frequency of the test clock signal is an integer multiple of the frequency of the periodic signals.

13. A test circuit which provides either an external clock signal or a high frequency test clock signal to an internal clock input of an SDRAM, the test circuit and the SDRAM being housed in a common package, comprising:

an external clock terminal for receiving the external clock signal;

a clock enable terminal for receiving a clock enable signal;

a test enable terminal for receiving a test enable signal;

a first buffer circuit having an input terminal coupled to the external clock terminal operable to couple the external clock terminal to an output terminal in response to a buffer enable signal on a buffer enable terminal;

an enable circuit having an input terminal coupled to the test enable terminal for receiving the test enable signal, an input terminal coupled to the clock enable terminal for receiving the clock enable signal, and an output terminal coupled to the buffer enable terminal of the first buffer circuit, the enable circuit operable to provide the buffer enable signal on the output terminal in response to at least one of the test enable signal and the clock enable signal being active;

a frequency multiplier circuit coupled to the output terminal of the first buffer circuit for receiving a first periodic signal having a first frequency applied to the external clock terminal and coupled to the clock enable terminal for receiving a second periodic signal having a second frequency applied to the clock enable terminal, the frequency multiplier circuit operable to provide on an output terminal the high frequency test clock signal derived from the first and second periodic signals, the high frequency test clock signal having a third frequency which is greater than the first and second frequencies;

a first transmission circuit having an input terminal coupled to the output terminal of the first buffer circuit, an enable terminal coupled to the test enable terminal, and an output terminal coupled to the internal clock input of the SDRAM, the first transmission circuit operable to couple the output terminal of the first buffer circuit to the internal clock input of the SDRAM in response to the test enable signal being inactive; and a second transmission circuit having an input terminal coupled to the output terminal of the frequency multiplier circuit, an enable terminal coupled to the test enable terminal and an output terminal coupled to the internal clock input of the SDRAM, the second transmission circuit operable to couple the output terminal of the frequency multiplier circuit to the internal clock input of the SDRAM in response to the test enable signal being active.

14. The test circuit of claim 13 wherein the second frequency is equal to the first frequency.

15. The test circuit of claim 14 wherein the second signal is phase shifted relative to the first signal by a magnitude of 90 degrees.

16. The test circuit of claim 15 wherein the frequency multiplier circuit comprises:

a first inverter having an input terminal coupled to the clock enable terminal for receiving the clock enable signal operable to provide on an output terminal an inverted clock enable signal;

a second inverter having an input terminal coupled to the output terminal of the first buffer circuit for receiving the external clock signal operable to provide on an output terminal an inverted external clock signal; and an exclusive NOR gate having a first input terminal coupled to the output terminal of the first buffer circuit, a second input terminal coupled to the output terminal of the first inverter, a third input terminal coupled to the clock enable terminal, and a fourth input terminal coupled to the output terminal of the second inverter, the exclusive NOR gate providing the high frequency test clock signal on an output terminal in response to the signals on its input terminals.

17. The test circuit of claim 14 wherein the second signal is phase shifted relative to the first signal by a magnitude of 180 degrees.

18. The test circuit of claim 17 wherein the frequency multiplier circuit comprises:

a first one-shot circuit having a trigger input coupled to the output terminal of the first buffer circuit which provides a first one-shot signal on an output terminal in response to a rising edge of the first periodic signal;

a second one-shot circuit having a trigger input coupled to the clock enable terminal which provides a second one-shot signal on an output terminal in response to a rising edge of the second periodic signal; and an OR gate having a first input terminal coupled to the output terminal of the first one-shot circuit and a second input terminal coupled to the output terminal of the second one-shot circuit, the OR gate providing the high frequency test clock signal on an output terminal.

19. The test circuit of claim 18 wherein the duration of each of the one-shot signals is equal to one fourth the period defined by the first frequency of the first periodic signal.

20. The test circuit of claim 13 wherein the first transmission circuit comprises a transmission gate having first and second complementary input terminals, the first complementary input terminal being coupled directly to the test enable terminal and the test enable terminal being coupled through an inverter to the second complementary input terminal.

21. The test circuit of claim 20 wherein the second transmission circuit comprises a transmission gate having first and second complementary input terminals, the second complementary input terminal being coupled directly to the test enable terminal and the test enable terminal being coupled through an inverter to the first complementary input terminal.

22. The test circuit of claim 13 wherein the enable circuit comprises a NOR gate.

23. An SDRAM of the type having an internal clock input, comprising:

an address bus;

a control bus;

a data bus;

a clock terminal adapted to receive a clock signal;

a clock enable terminal adapted to receive a clock enable signal;

a test enable terminal adapted to receive a test enable signal;

an address decoder coupled to the address bus;

a control logic circuit coupled the control bus;

a read/write circuit coupled to the data bus;

a memory-cell array coupled to the address decoder, the control logic circuit, and the read/write circuit, including a plurality of row lines;

a plurality of pairs of first and second complementary digit lines;

an array of memory cells that each have a control terminal coupled to one of the row lines and a data terminal coupled to one of the first and second complementary digit lines of one of the pairs of complementary digit lines; and a test circuit comprising a logic circuit having inputs coupled to the clock terminal, the clock enable terminal, and the test enable terminal and an output coupled to the internal clock input of the SDRAM, the logic circuit coupling the clock terminal to the output of the logic circuit responsive to the clock enable signal being active and the test enable signal being inactive, the logic circuit deriving a test clock signal from respective periodic signals applied to the clock and clock enable terminals and applying the test clock signal to the output of the logic circuit when the test enable signal is active. the test clock signal having a frequency that is greater than the frequencies of the periodic signals.

24. The SDRAM of claim 23 wherein the frequencies of the respective periodic signals are equal.

25. The SDRAM of claim 24 wherein the periodic signal applied to the clock enable terminal is phase shifted relative to the periodic signal applied to the clock terminal.

26. The SDRAM of claim 25 wherein the frequency of the test clock signal is twice the frequency of the periodic signals.

27. The SDRAM of claim 23 wherein each memory cell comprises:

a storage element having a first storage terminal and a second storage terminal. the second storage terminal coupled to a reference voltage source of approximately $V_{cc}/2$; and a memory switch circuit having a control terminal coupled to an associated row line. a first data terminal coupled to the first storage terminal of the storage element. and a second data terminal coupled to one of the associated first and second complementary digit lines.

28. A computer system. comprising:

a data input device;

a data output device;

an address bus;

a data bus;

a control bus; and computing circuitry coupled to the data input and output devices. and the data, address, and control busses. the computing circuitry including an SDRAM of the type having an internal clock input, the SDRAM having a test circuit for providing a test clock signal to the SDRAM, the test circuit and the SDRAM being housed in a common package having a clock terminal adapted to receive a clock signal, a clock enable terminal adapted to receive a clock enable signal, and a test enable terminal adapted to receive a test enable signal, the test circuit comprising a logic circuit having inputs coupled to the clock terminal, the clock enable terminal, and the test enable terminal of the package, and an output coupled to the internal clock input of the SDRAM. the logic circuit coupling the clock terminal to the output of the logic circuit responsive to the clock enable signal being active and the test enable signal being inactive, the logic circuit deriving the test clock signal from respective periodic signals applied to the clock and clock enable terminals and applying the test clock signal to the output of the logic circuit when the test enable signal is active. the test clock signal having a frequency that is greater than the frequencies of the periodic signals.

29. The system of claim 28 wherein the frequencies of the respective periodic signals are equal.

30. The system of claim 29 wherein the periodic signal applied to the clock enable terminal is phase shifted by a magnitude of 90 degrees relative to the periodic signal applied to the clock terminal.

31. The system of claim 30 wherein the frequency of the test clock signal is twice the frequency of the periodic signals.

32. A method for providing a high frequency test clock signal to an SDRAM of the type having an internal clock input. comprising the steps of:

receiving a clock signal on a clock terminal of the SDRAM;

receiving a clock enable signal on a clock enable terminal of the SDRAM;

receiving a test enable signal on a test enable terminal of the SDRAM;

deriving the high frequency test clock signal from respective periodic signals applied to the clock and clock enable terminals. the high frequency test clock signal having a frequency that is greater than the frequencies of the periodic signals;

providing the clock signal to the internal clock input when the clock enable signal is active and the test enable signal is inactive; and providing the high frequency test clock signal to the internal clock input when the test enable signal is active.

33. The method of claim 32 wherein the frequencies of the respective periodic signals are equal.

34. The method of claim 33 wherein the periodic signal applied to the clock enable terminal is phase shifted relative to the periodic signal applied to the clock terminal.

35. The method of claim 34 wherein the frequency of the test clock signal is twice the frequency of the periodic signals.

36. A method for providing a high frequency test clock signal to an SDRAM of the type having an internal clock input. comprising the steps of:

receiving a clock signal on a clock terminal of the SDRAM;

receiving a clock enable signal on a clock enable terminal of the SDRAM;

deriving the high frequency test clock signal from respective periodic signals applied to the clock and clock enable terminals. the high frequency test clock signal having a frequency that is greater than the frequencies of the periodic signals;

providing the clock signal to the internal clock input when the clock enable signal is active; and providing the high frequency test clock signal to the internal clock input when the respective periodic signals are applied to the clock and clock enable terminals.

37. The method of claim 36 wherein the frequencies of the respective periodic signals are equal.

38. The method of claim 37 wherein the periodic signal applied to the clock enable terminal is phase shifted relative to the periodic signal applied to the clock terminal.

39. The method of claim 38 wherein the frequency of the test clock signal is twice the frequency of the periodic signals.

* * * * *